(12) United States Patent
Yamashita

(10) Patent No.: US 10,009,004 B2
(45) Date of Patent: Jun. 26, 2018

(54) RESONATOR DEVICE, ELECTRONIC DEVICE, AND MOBILE OBJECT

(71) Applicant: Seiko Epson Corporation, Tokyo (JP)

(72) Inventor: Go Yamashita, Ina (JP)

(73) Assignee: Seiko Epson Corporation (JP)

( * ) Notice: Subject to any disclaimer, the term of this patent is extended or adjusted under 35 U.S.C. 154(b) by 334 days.

(21) Appl. No.: 14/812,103

(22) Filed: Jul. 29, 2015

(65) Prior Publication Data

US 2016/0035962 A1 Feb. 4, 2016

(30) Foreign Application Priority Data

Jul. 30, 2014 (JP) ................. 2014-154618

(51) Int. Cl.
*H03H 9/02* (2006.01)
*H03H 9/08* (2006.01)
*H03H 9/05* (2006.01)
*H03H 9/10* (2006.01)
*H03H 9/19* (2006.01)

(52) U.S. Cl.
CPC .......... *H03H 9/08* (2013.01); *H03H 9/02102* (2013.01); *H03H 9/0552* (2013.01); *H03H 9/1021* (2013.01); *H03H 9/19* (2013.01)

(58) Field of Classification Search
CPC .......... H01L 41/053; H03H 9/15; H03H 9/19
USPC ....................................... 310/340, 344, 348
See application file for complete search history.

(56) References Cited

U.S. PATENT DOCUMENTS 6,229,249 B1 * 5/2001 Hatanaka ............... H03B 5/04
310/348
2006/0214743 A1 9/2006 Arai et al.
2013/0328452 A1 12/2013 Fujihara et al.
(Continued)

FOREIGN PATENT DOCUMENTS

JP 2000-101346 A 4/2000
JP 2006-311496 A 11/2006
JP 2010-035078 A 2/2010
(Continued)

OTHER PUBLICATIONS

TXC Corporation: TXC launched new product—2520 Temperature Sensing Crystal (TSX) named OZ, Aug. 31, 2011; uploaded Apr. 18, 2018 from http://www.txccorp.com/index_en.php?action=a_about_news_data&cid_en=3&id=47. (3 pages).

Primary Examiner — Derek Rosenau
(74) Attorney, Agent, or Firm — Harness, Dickey & Pierce, P.L.C.

(57) ABSTRACT

A quartz crystal resonator includes a quartz crystal resonator element, a thermistor, and a package base having a first principal surface and a second principal surface having an opposed surface relationship with each other, the quartz crystal resonator element is mounted on the first principal surface side, the thermistor is housed in a recessed section of the second principal surface side of the package base, a plurality of electrode terminals connected to the quartz crystal resonator element or the thermistor is disposed on the second principal surface side of the package base, and a distance in a first direction perpendicular to the first principal surface from a mounting surface of the electrode terminals to the thermistor is equal to or longer than 0.05 mm.

9 Claims, 7 Drawing Sheets

(56) References Cited

U.S. PATENT DOCUMENTS

2016/0268494 A1    9/2016  Fujihara et al.

FOREIGN PATENT DOCUMENTS

| JP | 2013-055572 A | 3/2013 |
| JP | 2013-055573 A | 3/2013 |
| JP | 2013-070224 A | 4/2013 |
| JP | 2013-070312 A | 4/2013 |
| JP | 2013-070313 A | 4/2013 |
| JP | 2013-098608 A | 5/2013 |
| JP | 2013-102315 A | 5/2013 |
| JP | 2013-138341 A | 7/2013 |
| JP | 2013-143681 A | 7/2013 |
| JP | 2013-255052 A | 12/2013 |
| JP | 2014-175998 A | 9/2014 |

* cited by examiner

RESONATOR DEVICE, ELECTRONIC DEVICE, AND MOBILE OBJECT

BACKGROUND

1. Technical Field

The present invention relates to a resonator device, and an electronic apparatus and a mobile object each equipped with the resonator device.

2. Related Art

A known resonator device includes a piezoelectric device provided with a piezoelectric vibration element, a thermo-sensitive component, and a container having a first housing section for housing the piezoelectric vibration element, and a second housing section for housing the thermo-sensitive component, wherein the container is provided with a first insulating substrate having a through hole constituting the second housing section and provided with a plurality of mounting terminals disposed on a bottom section, a second insulating substrate, which is stacked on and fixed to the first insulating substrate, provided with a first electrode pad for mounting the piezoelectric vibration element disposed on the obverse surface, and provided with a second electrode pad for mounting the thermo-sensitive component disposed on the reverse surface, and a third substrate stacked on and fixed to the obverse (front) surface of the second insulating substrate to constitute the first housing section (see, e.g., JP-A-2013-102315).

According to JP-A-2013-102315, in the piezoelectric device, at least one of the mounting terminals and the first electrode pad are electrically connected to each other with a first heat-conduction section and a first wiring pattern, and at least one of the other mounting terminals and the second electrode pad are electrically connected to each other with a second heat-conduction section and a second wiring pattern to thereby make it possible to decrease the temperature difference between the temperature of the piezoelectric vibration element and the temperature detected by the thermo-sensitive component, and thus, a good frequency-temperature characteristic can be obtained.

However, in the piezoelectric device described above, depending on the distance from the mounting terminal of the first insulating terminal to the thermo-sensitive component in the second housing section in the thickness direction, when the piezoelectric device is mounted to an external member such as an electronic apparatus, there is a possibility that the temperature difference between the temperature of the piezoelectric vibration element and the temperature detected by the thermo-sensitive component in the period when, for example, the temperature falls become large due to the adiabatic effect of the air, which is accumulated in the second housing section, and is heated in the period when the temperature rises.

As a result, there is a possibility that the frequency-temperature characteristic of the piezoelectric device described above becomes worse.

SUMMARY

An advantage of some aspects of the invention is to solve at least a part of the problems described above, and the invention can be implemented as the following aspects or the application examples.

Application Example 1

A resonator device according to this application example includes a resonator element, an electronic element, and a substrate having a first principal surface and a second principal surface having an opposed surface relationship with each other, the resonator element is mounted on the first principal surface side of the substrate, the electronic element is housed in a recessed section disposed on the second principal surface side of the substrate, a plurality of electrode terminals connected to one of the resonator element and the electronic element is disposed on the second principal surface side of the substrate, and a distance in a first direction perpendicular to the first principal surface from a mounting surface of the electrode terminals to the electronic element is one of equal to and longer than 0.05 mm.

According to this configuration, in the resonator device, since the distance in the first direction (in other words, the thickness direction of the substrate) from the mounting surface of the electrode terminals to the electronic element is equal to or longer than 0.05 mm, in the case in which, for example, the resonator device is mounted to an external member such as an electronic apparatus, the flow of the air in the recessed section is promoted, and thus, the delay of the temperature drop of the electronic element due to the accumulation of the air in the recessed section can be reduced.

As a result, in the resonator device, in the case of using the thermo-sensitive element (a thermo-sensitive component) as the electronic element, the temperature difference between the temperature of the resonator element and the temperature detected by the thermo-sensitive element can be reduced.

Thus, it is possible for the resonator device to obtain a good frequency-temperature characteristic.

Application Example 2

In the resonator device according to the application example described above, it is preferable that a distance in the first direction from the mounting surface of the electrode terminals to a bottom surface of the recessed section is shorter than 0.3 mm.

According to this configuration, in the resonator device, since the distance in the first direction from the mounting surface of the electrode terminals to the bottom surface of the recessed section is shorter than 0.3 mm, the height reduction can be achieved while decreasing the temperature difference between the temperature of the resonator element and the temperature detected by the thermo-sensitive element.

Thus, it is possible for the resonator device to obtain a good frequency-temperature characteristic while achieving the height reduction.

Application Example 3

In the resonator device according to the application example described above, it is preferable that a distance in the first direction between a first imaginary center line passing through a center of the electronic element in the first direction and extending along the first principal surface and a second imaginary center line passing through a center of the resonator element in the first direction and extending along the first principal surface is within a range of not smaller than 0.18 mm and not larger than 0.32 mm.

According to this configuration, in the resonator device, since the distance in the first direction between the first imaginary center line of the electronic element and the second imaginary center line of the resonator element is within the range of not smaller than 0.18 mm and not larger than 0.32 mm, in the case in which, for example, the thermo-sensitive element is used as the electronic element, the height reduction can further be achieved while decreasing the temperature difference between the temperature of the resonator element and the temperature detected by the thermo-sensitive element.

Application Example 4

In the resonator device according to the application example described above, it is preferable that one of the electrode terminals is provided with a projecting section, and is larger in area than the other electrode terminals in a planar view, and a contour of the projecting section includes a curve.

According to this configuration, in the resonator device, since one of the electrode terminals is provided with the projecting section in a planar view and is larger in area than the other electrode terminals, and the contour of the projecting section includes a curve, the self-alignment effect (an autonomous position restoration phenomenon in reflow mounting when attaching the quartz crystal resonator to the external board via solder) of the resonator device can easily be brought out using this electrode terminal as a base point in addition to the identification function of the electrode terminal.

Application Example 5

In the resonator device according to the application example described above, it is preferable that the electronic element is a thermo-sensitive element.

According to this configuration, in the resonator device, since the thermo-sensitive element is used as the electronic element, the temperature difference between the temperature of the resonator element and the temperature detected by the thermo-sensitive element can be reduced.

Application Example 6

In the resonator device according to the application example described above, it is preferable that the thermo-sensitive element is one of a thermistor and a temperature measuring semiconductor.

According to this configuration, in the resonator device, since the thermistor or the temperature measuring semiconductor is used as the thermo-sensitive element, the ambient temperature can correctly be detected due to the characteristic of the thermistor or the temperature measuring semiconductor.

Application Example 7

An electronic apparatus according to this application example includes the resonator device according to any of the application examples described above.

According to this configuration, since the electronic apparatus having the present configuration is provided with the resonator device according to any one of the application examples described above, there can be provided the electronic apparatus provided with the advantages described in any one of the application examples described above and exerting the excellent performance.

Application Example 8

A mobile object according to this application example includes the resonator device according to any of the application examples described above.

According to this configuration, since the mobile object having the present configuration is provided with the resonator device according to any one of the application examples described above, there can be provided the mobile object provided with the advantages described in any one of the application examples described above and exerting the excellent performance.

Application Example 9

A resonator device according to this application example includes a resonator element, a thermo-sensitive element, and a container housing the resonator element and the thermo-sensitive element, and a temperature difference dT between a temperature of the resonator element and a temperature detected by the thermo-sensitive element fulfills the following formula.

$$|dT| \leq 0.1 (°C.)$$

As a result, in the resonator device, the temperature difference between the temperature of the resonator element and the temperature detected by the thermo-sensitive element can be reduced.

Thus, it is possible for the resonator device to obtain a good frequency-temperature characteristic.

Application Example 10

In the resonator device according to Application Example 9, it is preferable that the thermo-sensitive element is one of a thermistor and a temperature measuring semiconductor.

According to this configuration, in the resonator device, since the thermistor or the temperature measuring semiconductor is used as the thermo-sensitive element, the ambient temperature can correctly be detected due to the characteristic of the thermistor or the temperature measuring semiconductor.

Application Example 11

An electronic apparatus according to this application example includes the resonator device described in one of Application Examples 9 and 10.

According to this configuration, since the electronic apparatus having the present configuration is provided with the resonator device according to one of Application Example 9 and Application Example 10, there can be provided the electronic apparatus provided with the advantages described in one of Application Example 9 and Application Example 10, and exerting the excellent performance.

Application Example 12

A mobile object according to this application example includes the resonator device described in one of Application Examples 9 and 10.

According to this configuration, since the mobile object having the present configuration is provided with the resonator device according to one of Application Example 9 and Application Example 10, there can be provided the mobile object provided with the advantages described in one of Application Example 9 and Application Example 10, and exerting the excellent performance.

BRIEF DESCRIPTION OF THE DRAWINGS

Embodiments of the invention will be described with reference to the accompanying drawings, wherein like numbers reference like elements.

FIGS. 1A through 1C are schematic diagrams showing a general configuration of a quartz crystal resonator according to a first embodiment of the invention, wherein FIG. 1A is a plan view viewed from a lid (lid body) side, FIG. 1B is a cross-sectional view along the A-A line shown in FIG. 1A, and FIG. 1C is a plan view viewed from the bottom side.

FIGS. 6A through 6C are schematic diagrams showing a general configuration of a quartz crystal resonator according to a modified example of the first embodiment, wherein FIG. 6A is a plan view viewed from the lid side, FIG. 6B is a cross-sectional view along the A-A line shown in FIG. 6A, and FIG. 6C is a plan view viewed from the bottom side.

FIGS. 7A through 7C are schematic diagrams showing a general configuration of a quartz crystal resonator according to a second embodiment of the invention, wherein FIG. 7A is a plan view viewed from the lid side, FIG. 7B is a cross-sectional view along the A-A line shown in FIG. 7A, and FIG. 7C is a plan view viewed from the bottom side.

DESCRIPTION OF EXEMPLARY EMBODIMENTS

Some embodiments of the invention will be hereinafter explained with reference to the accompanying drawings.

First Embodiment

Firstly, a quartz crystal resonator as an example of a resonator device will be explained.

Figure 1A:
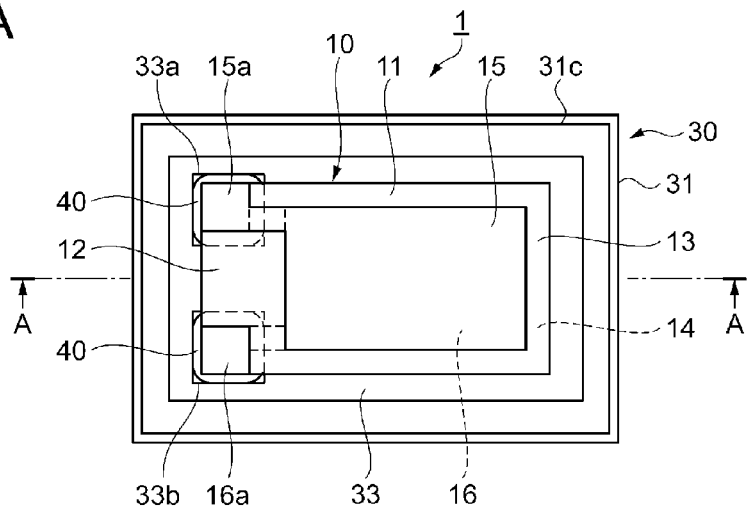
Figure 1B:
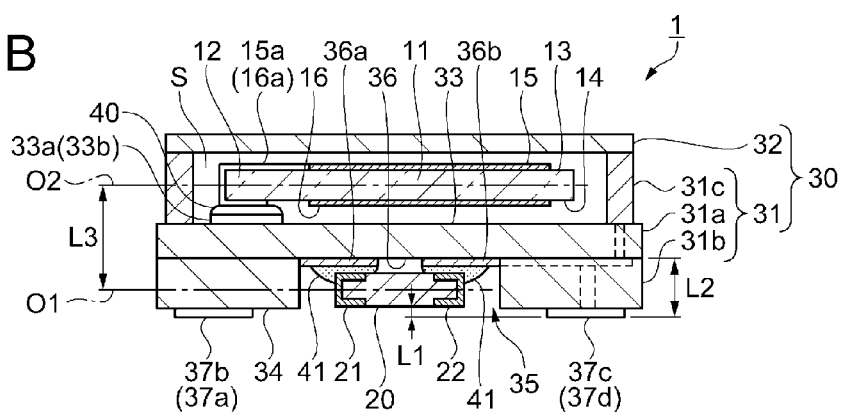
Figure 1C:
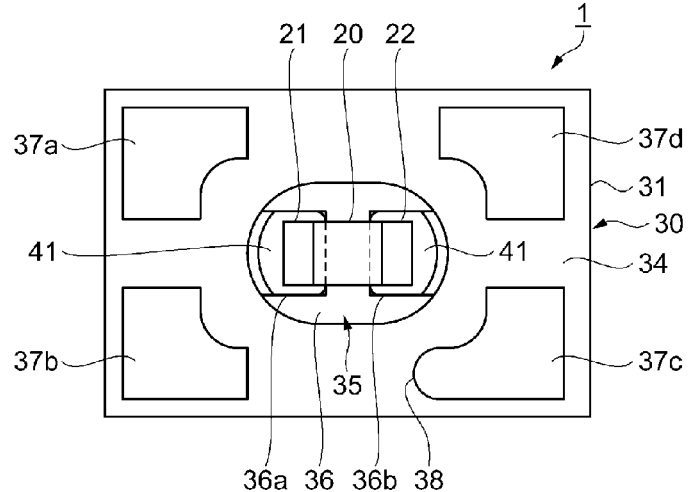

FIGS. 1A through 1C are schematic diagrams showing a general configuration of the quartz crystal resonator according to the first embodiment. FIG. 1A is a plan view viewed from the lid (a lid member) side, FIG. 1B is a cross-sectional view along the A-A line shown in FIG. 1A, and FIG. 1C is a plan view viewed from the bottom side. It should be noted that in the plan view viewed from the lid side described below including FIG. 1A, the lid is omitted. Further, the dimensional ratio of each of the constituents is different from the actual device for the sake of easier understanding.

Figure 2:
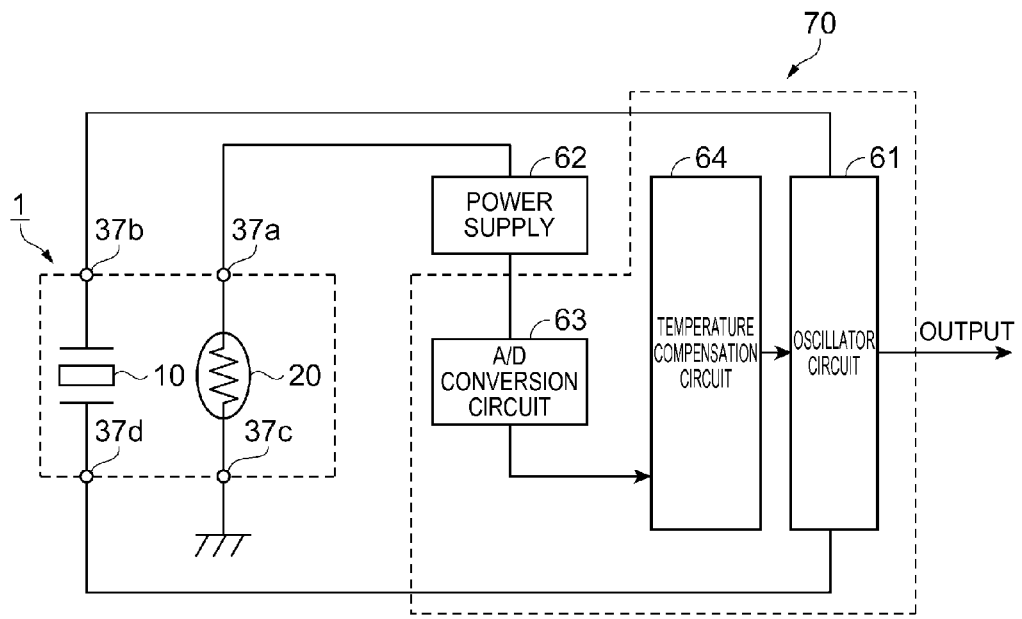
FIG. 2 is a circuit diagram related to drive of the quartz crystal resonator including a thermo-sensitive element as an electronic element housed in the quartz crystal resonator according to the first embodiment.

FIG. 2 is a circuit diagram related to drive of the quartz crystal resonator including a thermo-sensitive element as an electronic element housed in the quartz crystal resonator according to the first embodiment.

As shown in FIGS. 1A through 1C, the quartz crystal resonator 1 is provided with a quartz crystal resonator element 10 as a resonator element, a thermistor 20 as an example of a thermo-sensitive element as an electronic device, and a package 30 housing the quartz crystal resonator element 10 and the thermistor 20.

The quartz crystal resonator element 10 is an AT-cut quartz crystal substrate carved out at a predetermined angle from, for example, a quartz crystal raw stone, and has a vibrating section 11, which is formed to have a roughly rectangular planer shape, and on which a thickness-shear vibration is excited, and a base section 12 connected to the vibrating section 11 as a unit.

In the quartz crystal resonator element 10, extraction electrodes 15a, 16a, which are extracted from excitation electrodes 15, 16 each having a roughly rectangular shape and respectively formed on one principal surface 13 and the other principal surface 14 of the vibrating section 11, are provided to the base section 12.

The extraction electrode 15a is extracted from the excitation electrode 15 on the one principal surface 13 along the longitudinal direction (the horizontal direction on the sheet of the drawings) of the quartz crystal resonator element 10 to the base section 12, then wraps around the base section 12 to the other principal surface 14 along the side surface of the base section 12, and then extends to the other principal surface 14 of the base section 12.

The extraction electrode 16a is extracted from the excitation electrode 16 on the other principal surface 14 along the longitudinal direction of the quartz crystal resonator element 10 to the base section 12, then wraps around the base section 12 to the one principal surface 13 along the side surface of the base section 12, and then extends to the one principal surface 13 of the base section 12.

The excitation electrodes 15, 16 and the extraction electrodes 15a, 16a are each formed of a metal coating having a configuration of, for example, using Cr (chromium) as a foundation layer and stacking Au (gold) or metal consisting mainly of Au on the foundation layer.

The thermistor 20 is, for example, a chip type (having a rectangular solid shape) thermo-sensitive element (thermo-sensitive resistor element), which is a resistive element having electrodes 21, 22 disposed at both end portions, and has a large variation in electrical resistance with the temperature variation.

As the thermistor 20, there is used, for example, a thermistor called a negative temperature coefficient (NTC) thermistor having a resistance decreasing in accordance with rise in temperature. The NTC thermistor has a linear relationship between the change in temperature and the change in resistance value, and is therefore heavily used as a temperature sensor.

The thermistor 20 is housed in the package 30, and detects the temperature in the vicinity of the quartz crystal resonator element 10 to thereby serve a function of making a contribution to the correction of a frequency variation due to the temperature variation of the quartz crystal resonator element 10 as the temperature sensor.

The package 30 has a package base 31 as a substrate having a roughly rectangular planar shape and a roughly plate-like shape, and having a first principal surface 33 and a second principal substrate 34 having an opposed surface relationship with each other, and a lid 32 having a plate-like shape for covering the first principal surface 33 side of the package base 31, and is configured to have a roughly rectangular solid shape.

The package base 31 is provided with a first layer 31a, which has a plate-like shape, and one of the surfaces of which forms the first principal surface 33, a second layer 31b, which is stacked on an opposite side of the first layer 31a to the first principal surface 33, and a surface of which on the opposite side to the stacked surface forms the second principal surface 34, and a third layer 31c having a frame shape stacked on the first principal surface 33 side of the first layer 31a.

For the first layer 31a and the second layer 31b of the package base 31A, there is used a ceramic insulating material obtained by molding and then calcining a ceramic green sheet such as an aluminum oxide sintered body, a mullite sintered body, an aluminum nitride sintered body, a silicon carbide sintered body, or a glass ceramics sintered body, quartz crystal, glass, silicon (high-resistivity silicon) or the like.

As the third layer 31c of the package base 31 and the lid 32, there is used the same material as that of the package base 31, or metal such as kovar or 42-alloy.

The first principal surface 33 of the package base 31 is provided with internal terminals 33a, 33b disposed at positions opposed to the extraction electrodes 15a, 16a of the quartz crystal resonator element 10, respectively.

In the quartz crystal resonator element 10, the extraction electrodes 15a, 16a are respectively bonded to the internal terminals 33a, 33b via an electrically-conductive adhesive 40 such as an epoxy adhesive, a silicone adhesive, or a polyimide adhesive each mixed with an electrically-conductive material such as a metal filler. Thus, it results that the quartz crystal resonator element 10 is mounted on the first principal surface 33 side.

In the quartz crystal resonator 1, in the state in which the quartz crystal resonator element 10 is bonded to the internal terminals 33a, 33b of the package base 31, the third layer 31c of the package base 31 is covered with the lid 32, and the package base 31 and the lid 32 are bonded to each other using seam welding, or bonding material such as a low-melting-point glass or an adhesive, and thus, an internal space S configured including the first layer 31a and the third layer 31c of the package base 31, and the lid 32 is airtightly sealed.

FIGS. 1A through 1C show a configuration, in which the third layer 31c made of metal and the lid 32 made of metal are bonded to each other using the seam welding, as an example. It should be noted that in this case, the third layer 31c is brazed to a metalization layer (not shown) of the first layer 31a.

The internal space S of the package 30 airtightly sealed is in a reduced pressure vacuum state (a state with a high degree of vacuum), or a state of being filled with an inert gas such as nitrogen, helium, or argon.

On the second principal surface 34 side of the package base 31, there is disposed a recessed section 35 formed of an opening section of the second layer 31b and stacked layer surface of the first layer 31a. The recessed section 35 is formed to have a planar shape like, for example, a racetrack.

On a bottom surface 36 of the recessed section 35 (the stacked layer surface of the first layer 31a), there are disposed electrode pads 36a, 36b at positions opposed to the electrodes 21, 22 of the thermistor 20, respectively.

The thermistor 20 has the electrodes 21, 22 bonded to the electrode pads 36a, 36b via a bonding material 41 such as an electrically-conductive adhesive or solder. Thus, it results that the thermistor 20 is housed in the recessed section 35.

It should be noted that the thermistor 20 is disposed in a roughly central portion of the recessed section 35 so that the longitudinal direction (the direction of a line connecting the electrodes 21, 22 to each other) is parallel to the longitudinal direction (the horizontal direction of the sheet of the drawings) of the package base 31.

On the four corners of the second principal surface 34 of the package base 31, there are disposed electrode terminals 37a, 37b, 37c, and 37d, respectively.

Out of the four electrode terminals 37a through 37d, the two electrode terminals 37b, 37d located on one of the diagonals, for example, are connected to the internal terminals 33a, 33b connected to the extraction electrodes 15a, 16a of the quartz crystal resonator element 10, respectively, and the rest two electrode terminals 37a, 37c located on the other of the diagonals are connected to the electrode pads 36a, 36b connected to the electrodes 21, 22 of the thermistor 20, respectively.

The four electrode terminals 37a through 37d are each formed to have a planar shape obtained by cutting out a part, which is located on the recessed section 35 side, from a rectangular shape. The electrode terminal 37c is provided with a projecting section 38 extending toward the electrode terminal 37b so as to be larger in the area than the other electrode terminals 37a, 37b, and 37d in the planar view, and the tip portion of the projecting section 38 is formed to have a roughly semicircular shape (in other words, the contour of the projecting section 38 includes a curve).

It should be noted that in the case in which the lid 32 and the third layer 31c of the package base 31 are made of metal, it is preferable for the electrode terminal 37c to electrically be connected to the lid 32 via the third layer 31c using any of conductive via holes (conductive electrodes each obtained by filling a through hole with metal or a material having electrical conductivity) respectively penetrating the first layer 31a and the second layer 31b of the package base 31 and internal wiring, and an electrically-conductive film formed on a castellation (a recessed section) not shown disposed on an outer corner of the package base 31 from a viewpoint of improving the shielding performance. It should be noted that in the case in which the third layer 31c is made of an insulating material, it is required to provide a conductive via hole also to the third layer 31c.

Further, it is possible for the quartz crystal resonator 1 to further improve the shielding performance by grounding the electrode terminal 37c as an earth terminal (a GND terminal).

It should be noted that the internal terminals 33a, 33b, the electrode pads 36a, 36b, the electrode terminals 37a through 37d are each formed of a metal coating obtained by stacking coating films made of nickel (Ni), Au, and the like on the metalization layer made of, for example, tungsten (W) or molybdenum (Mo) by plating or the like.

In the quartz crystal resonator 1, the distance L1 in a first direction (the thickness direction of the package base 31) perpendicular to the first principal surface 33 from the mounting surface (an attachment surface to an external member) of the electrode terminals 37a through 37d to the thermistor 20 is defined to be equal to or longer than 0.05 mm.

Further, in the quartz crystal resonator 1, the distance L2 in the first direction from the mounting surface of the electrode terminals 37a through 37d to the bottom surface 36 of the recessed section 35 is defined to be shorter than 0.3 mm.

As an example, in the quartz crystal resonator 1, a member having a thickness of 0.25 mm±0.01 mm (not smaller than 0.24 mm and not larger than 0.26 mm) is used as the second layer 31b of the package base 31, the thickness of each of the electrode terminals 37a through 37d is regulated to 0.02 mm±0.01 mm (not smaller than 0.01 mm and not larger than 0.03 mm), the thickness of each of the electrode pads 36a, 36b is regulated to 0.02 mm±0.01 mm (not smaller than 0.01 mm and not larger than 0.03 mm), the thickness of the bonding material 41 is regulated to 0.01 mm±0.005 mm (not smaller than 0.005 mm and not larger than 0.015 mm), and a low-profile model with a thickness of 0.12 mm±0.015 mm (not smaller than 0.105 mm and not larger than 0.135 mm) is used as the thermistor 20.

Thus, in the quartz crystal resonator 1, it results that the distance L1 becomes 0.12 mm±0.05 mm (not smaller than 0.07 mm and not larger than 0.17 mm), namely 0.07 mm at the minimum, and sufficiently satisfies the standard of not smaller than 0.05 mm.

Further, in the quartz crystal resonator 1, it results that the distance L2 becomes 0.27 mm±0.02 mm (not smaller than 0.25 mm and not larger than 0.29 mm), namely 0.29 mm at the maximum, and sufficiently satisfies the standard of smaller than 0.3 mm.

From the facts described above, the quartz crystal resonator 1 meets the standard for the distances L1, L2 even taking the tolerance into consideration, and can be said to sufficiently be able to be put into mass production.

Further, in the quartz crystal 1, the distance L3 in the first direction between a first imaginary center line O1 passing through the center in the first direction of the thermistor 20 and extending along the first principal surface 33, and a second imaginary center line O2 passing through the center in the first direction of the quartz crystal resonator element 10 and extending along the first principal surface 33 is within a range of not smaller than 0.18 mm and not larger than 0.32 mm.

As an example, in the quartz crystal resonator 1, a member having a thickness of 0.09 mm through 0.11 mm is used as the first layer 31a of the package base 31, the thickness of each of the internal terminals 33a, 33b is regulated to 0.003 mm through 0.013 mm, the thickness of the electrically-conductive adhesive 40 is regulated to 0.01 mm through 0.03 mm, the thickness of the quartz crystal resonator element 10 (assuming that the resonance frequency range is about 19 through 52 MHz) is regulated to 0.032 mm through 0.087 mm, the thickness of each of the electrode pads 36a, 36b is regulated to 0.01 mm through 0.03 mm, the thickness of the bonding material 41 is regulated to a range of 0.005 mm through 0.015 mm, and a low-profile model having a thickness regulated to a range of 0.105 mm through 0.135 mm is used as the thermistor 20.

Thus, the distance L3 becomes a range of 0.187 through 0.309 mm, and therefore sufficiently satisfies the standard of not smaller than 0.18 mm and not larger than 0.32 mm, and the quartz crystal resonator 1 meets the standard for the distance L3 even taking the tolerance into consideration, and can be said to sufficiently be able to be put into mass production.

It should be noted that in the case in which the quartz crystal resonator element 10 is tilted (the distance between a part of the quartz crystal resonator element 10 and the first principal surface 33 decreases as the position of the part moves from the base section 12 toward the tip portion located on the opposite side), the distance L3 is defined as the distance between the first imaginary center line O1 and the second imaginary center line O2 with the position in the horizontal direction of the sheet of the drawings included in a range of the internal terminal 33a (33b).

As shown in FIG. 2, the thickness-shear vibration is excited in the quartz crystal resonator element 10 due to the drive signal applied from, for example, an oscillator circuit 61 integrated in an IC chip 70 of an electronic apparatus via the electrode terminals 37b, 37d, and the quartz crystal resonator element 10 resonates (oscillates) at a predetermined frequency, and the quartz crystal resonator 1 outputs a resonance signal (an oscillation signal) from the electrode terminals 37b, 37d.

As such, the quartz crystal resonator 1 detects the temperature in the vicinity of the quartz crystal resonator element 10 using the thermistor 20 as the temperature sensor, then converts the result into a variation of the voltage value supplied from the power supply 62, and then outputs the result as a detection signal from the electrode terminal 37a.

The detection signal thus output is subjected to A/D conversion by, for example, an A/D conversion circuit 63 integrated in the IC chip 70 of the electronic apparatus, and is then input to a temperature compensation circuit 64 also integrated in the IC chip 70. Then, the temperature compensation circuit 64 outputs a correction signal based on the temperature compensation data in accordance with the detection signal input to the oscillator circuit 61.

The oscillator circuit 61 applies the drive signal, which has been corrected based on the correction signal thus input, to the quartz crystal resonator element 10 to correct the resonance frequency of the quartz crystal resonator element 10 varying in accordance with the temperature variation to a predetermined frequency. The oscillator circuit 61 amplifies and then outputs the oscillation signal with the frequency thus corrected to the outside.

As described above, in the quartz crystal resonator 1 according to the first embodiment, the distance L1 in the first direction from the mounting surface of the electrode terminals 37a through 37d to the thermistor 20 is equal to or longer than 0.05 mm.

As described above, in the quartz crystal resonator 1, by setting the distance L1 from the mounting surface of the electrode terminals 37a through 37d to the thermistor 20 to be equal to or longer than 0.05 mm by using the low-profile thermistor 20, when the quartz crystal resonator 1 is mounted to an external member such as an electronic apparatus, flow of the air in the recessed section 35 is promoted, and thus, a delay in temperature drop of the thermistor 20 due to the accumulation of the air in the recessed section 35 can be reduced.

Here, the contents described above will be described in detail.

Figure 3:
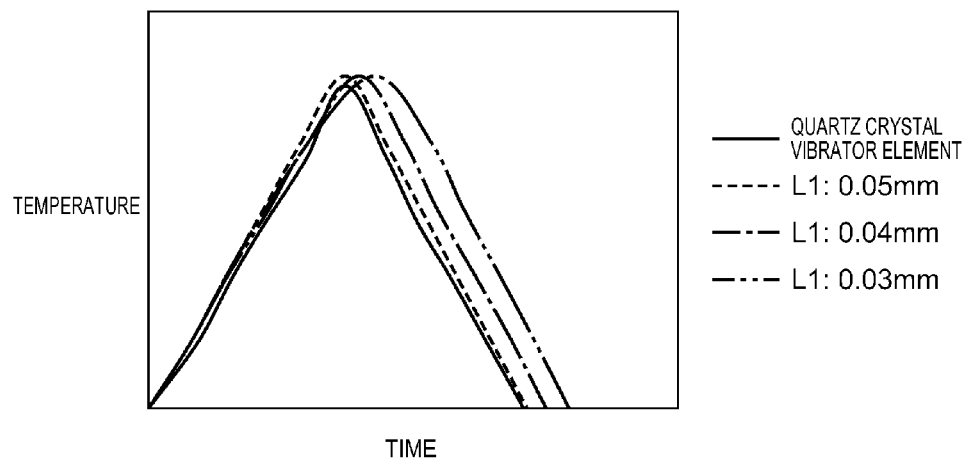
FIG. 3 is a graph for explaining a relationship between a distance and the temperature change of a thermistor in the period when the change in temperature of a quartz crystal resonator element.
Figure 4:
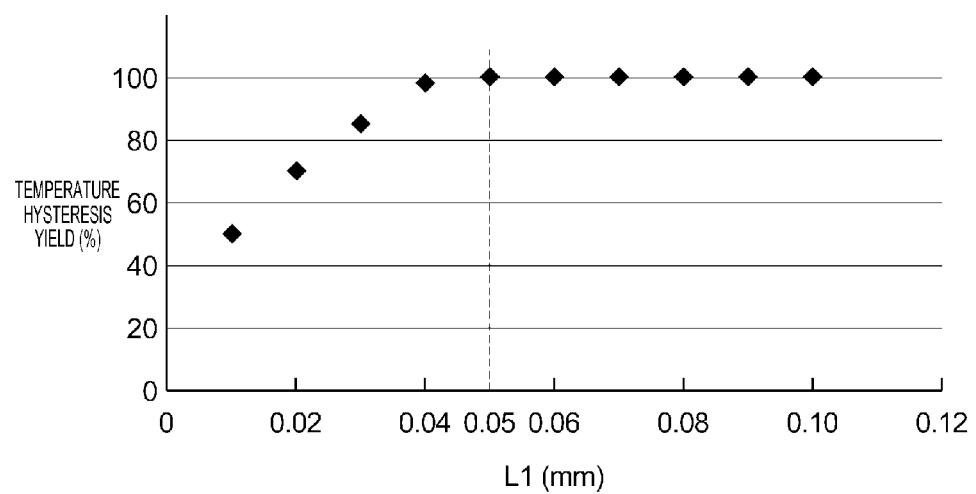
FIG. 4 is a graph for explaining a relationship between the distance and a yield of a temperature hysteresis of the quartz crystal resonator.

FIG. 3 is a graph for explaining a relationship between the distance L1 and the resultant temperature change of the thermistor in the period when the temperature of the quartz crystal resonator element varies, and FIG. 4 is a graph for explaining a relationship between the distance L1 and a yield of a temperature hysteresis of the quartz crystal resonator. It should be noted that the graph shown in FIG. 3 is based on an analysis result of a simulation and an experiment.

The horizontal axis of FIG. 3 represents elapsed time, and the vertical axis thereof represents the temperature. The horizontal axis of FIG. 4 represents the distance L1, and the vertical axis represents the yield of the temperature hysteresis of the quartz crystal resonator.

As shown in FIG. 3, in the case in which the distance L1 from the mounting surface of the electrode terminals 37a through 37d to the thermistor 20 is 0.05 mm, the temperature variation detected by the thermistor 20 follows the temperature variation of the quartz crystal resonator element 10 with little delay when the temperature rises and when the temperature falls. In other words, in the case in which the distance L1 is 0.05 mm, it results that there is little temperature difference between the temperature of the quartz crystal resonator element 10 and the temperature detected by the thermistor 20.

In contrast, in the case in which the distance L1 is shorter than 0.05 mm, a delay occurs in the temperature variation (temperature drop) detected by the thermistor 20 when the temperature of the quartz crystal resonator element falls, and the temperature difference between the temperature of the quartz crystal resonator element 10 and the temperature detected by the thermistor 20 increases as the distance L1 decreases to 0.04 mm and then 0.03 mm.

It is conceivable that the reason therefor is that the temperature drop of the thermistor 20 is hindered by the adiabatic effect of the air having been heated when the temperature rises caused by the accumulation of the air in the recessed section 35 due to the decrease in the distance L1.

Due to the facts described above, as shown in FIG. 4, in the case in which the distance L1 is equal to or longer than 0.05 mm, the yield of the temperature hysteresis (a difference between the frequency deviation in the period when the temperature rises and the frequency deviation in the period when the temperature falls) of the quartz crystal resonator 1 is 100%.

In contrast, in the case in which the distance L1 is shorter than 0.05 mm, the yield of the temperature hysteresis of the quartz crystal resonator 1 fails to reach 100%, and the yield becomes worse as the distance L1 decreases to 0.04 mm and then 0.03 mm.

According to such a result, in the quartz crystal resonator 1, by setting the distance L1 to be equal to or longer than 0.05 mm, it is possible to reduce the temperature difference between the temperature of the quartz crystal resonator element 10 and the temperature detected by the thermistor 20.

Thus, it is possible for the quartz crystal resonator 1 to obtain a good frequency-temperature characteristic.

Since the inventors conducted a verification experiment regarding the correspondence of the temperature variation of the thermistor 20 in the period when the temperature of the quartz crystal resonator element 10 varied, the result will hereinafter be explained.

According to the analysis result shown in FIGS. 3 and 4 described above, at the distance L1=0.05 mm with which the temperature difference between the temperature of the quartz crystal resonator element 10 and the temperature detected by the thermistor 20 hardly occurred, the experiment was conducted regarding the correspondence of the temperature detected by the thermistor 20 with respect to the temperature of the quartz crystal resonator element 10.

The quartz crystal resonator 1 according to the first embodiment was mounted on an external board, and while gradually applying the heat to the external board, the temperature detected by the thermistor 20 and the temperature of the quartz crystal resonator 10 at that moment were compared with each other, and the level of the temperature difference was evaluated.

Firstly, the temperature of the external board was gradually raised from 29.0° C. to 32.0° C. During this time, the thermistor 20 detected the temperature from 29.5° C. to 31.5° C. by 0.1° C., the frequency of the quartz crystal resonator element 10 at the detection temperature was measured, and the frequency deviation was obtained with reference to the frequency of the quartz crystal resonator element 10 at the moment when the thermistor 20 detected the temperature of 29.5° C.

Then, the temperature of the external board gradually fell from 32.0° C. to 29.0° C. During this time, the thermistor 20 detected the temperature from 31.5° C. to 29.5° C. by 0.1° C., the frequency of the quartz crystal resonator element 10 at the detection temperature was measured, and the frequency deviation was obtained with reference to the frequency of the quartz crystal resonator element 10 at the moment when the thermistor 20 detected the temperature of 29.5° C. in the period when the temperature rises.

The values described above are shown in Table 1 below.

TABLE 1

| | Temperature (° C.) detected by thermistor | | | | | | | | | | |
|---|---|---|---|---|---|---|---|---|---|---|---|
| | 29.50 | 29.60 | 29.70 | 29.80 | 29.90 | 30.00 | 30.10 | 30.20 | 30.30 | 30.40 | 30.50 |
| Frequency deviation (ppm) when vibrating element temperature rises | 0.00 | −0.03 | −0.06 | −0.08 | −0.11 | −0.14 | −0.16 | −0.19 | −0.22 | −0.25 | −0.27 |
| Frequency deviation (ppm) when vibrating element temperature falls | 0.01 | −0.02 | −0.05 | −0.08 | −0.10 | −0.13 | −0.16 | −0.19 | −0.22 | −0.24 | −0.27 |

| | Temperature (° C.) detected by thermistor | | | | | | | | | |
|---|---|---|---|---|---|---|---|---|---|---|
| | 30.60 | 30.70 | 30.80 | 30.90 | 31.00 | 31.10 | 31.20 | 31.30 | 31.40 | 31.50 |
| Frequency deviation (ppm) when vibrating element temperature rises | −0.30 | −0.33 | −0.36 | −0.38 | −0.41 | −0.44 | −0.47 | −0.49 | −0.52 | −0.55 |

TABLE 1-continued

| | | | | | | | | | | |
|---|---|---|---|---|---|---|---|---|---|---|
| Frequency deviation (ppm) when vibrating element temperature falls | −0.30 | −0.33 | −0.36 | −0.38 | −0.41 | −0.44 | −0.47 | −0.50 | −0.52 | −0.54 |

Here, since the quartz crystal resonator element 10 is the AT-cut quartz crystal resonator element, the frequency-temperature characteristic exhibits a cubic curve. The inventors calculated the temperature of the quartz crystal resonator element 10 from the frequency deviation of the quartz crystal resonator element 10 at the temperature detected by the thermistor 20 based on the data of the frequency-temperature characteristic of the quartz crystal resonator element 10 having been measured in advance.

The values described above are shown in Table 2 below.

TABLE 2

| | Temperature (° C.) detected by thermistor | | | | | | | | | |
|---|---|---|---|---|---|---|---|---|---|---|
| | 29.50 | 29.60 | 29.70 | 29.80 | 29.90 | 30.00 | 30.10 | 30.20 | 30.30 | 30.40 | 30.50 |
| Temperature (° C.) of vibrating element when temperature rises | 29.50 | 29.59 | 29.69 | 29.79 | 29.89 | 29.98 | 30.08 | 30.18 | 30.28 | 30.38 | 30.47 |
| Temperature (° C.) of vibrating element when temperature falls | 29.47 | 29.57 | 29.67 | 29.77 | 29.86 | 29.97 | 30.06 | 30.16 | 30.26 | 30.36 | 30.46 |

| | Temperature (° C.) detected by thermistor | | | | | | | | | |
|---|---|---|---|---|---|---|---|---|---|---|
| | 30.60 | 30.70 | 30.80 | 30.90 | 31.00 | 31.10 | 31.20 | 31.30 | 31.40 | 31.50 |
| Temperature (° C.) of vibrating element when temperature rises | 30.57 | 30.66 | 30.76 | 30.86 | 30.96 | 31.05 | 31.15 | 31.25 | 31.35 | 31.43 |
| Temperature (° C.) of vibrating element when temperature falls | 30.56 | 30.66 | 30.76 | 30.86 | 30.96 | 31.05 | 31.16 | 31.25 | 31.35 | 31.43 |

Then, the temperature difference between the temperature detected by the thermistor 20 and the temperature of the quartz crystal resonator element 10 at the temperature detected by the thermistor 20 was calculated from Table 2.

The values described above are shown in Table 3 below.

TABLE 3

| | Temperature (° C.) detected by thermistor | | | | | | | | | |
|---|---|---|---|---|---|---|---|---|---|---|
| | 29.50 | 29.60 | 29.70 | 29.80 | 29.90 | 30.00 | 30.10 | 30.20 | 30.30 | 30.40 | 30.50 |
| Temperature difference (° C.) when temperature rises | 0.00 | −0.01 | −0.01 | −0.01 | −0.01 | −0.02 | −0.02 | −0.02 | −0.02 | −0.02 | −0.03 |

TABLE 3-continued

| | | | | | | | | | | | |
|---|---|---|---|---|---|---|---|---|---|---|---|
| Temperature difference (° C.) when temperature falls | −0.03 | −0.03 | −0.03 | −0.03 | −0.04 | −0.03 | −0.04 | −0.04 | −0.04 | −0.04 | −0.04 |

| | Temperature (° C.) detected by thermistor | | | | | | | | | |
|---|---|---|---|---|---|---|---|---|---|---|
| | 30.60 | 30.70 | 30.80 | 30.90 | 31.00 | 31.10 | 31.20 | 31.30 | 31.40 | 31.50 |
| Temperature difference (° C.) when temperature rises | −0.03 | −0.04 | −0.04 | −0.04 | −0.04 | −0.05 | −0.05 | −0.05 | −0.05 | −0.07 |
| Temperature difference (° C.) when temperature falls | −0.04 | −0.04 | −0.04 | −0.04 | −0.04 | −0.05 | −0.04 | −0.05 | −0.05 | −0.07 |

Figure 5:
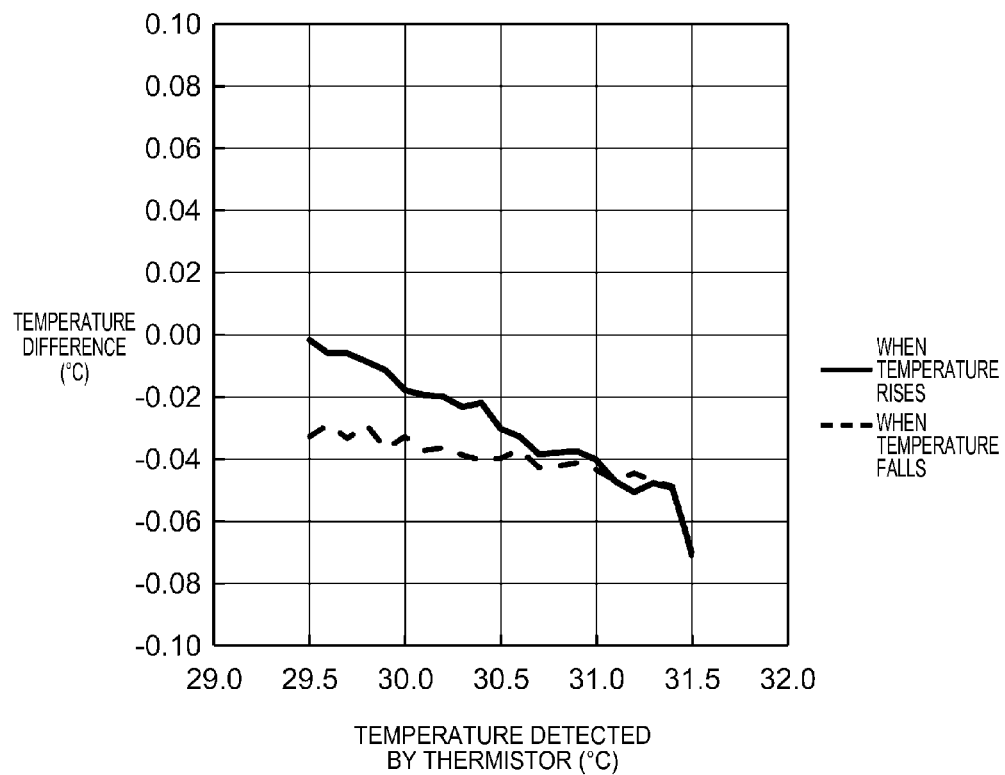
FIG. 5 is a graph showing a temperature difference between the temperature detected by the thermistor and the temperature of a resonator element.

FIG. 5 is a graph showing the temperature difference between the temperature detected by the thermistor 20 and the temperature of the quartz crystal resonator element, and is obtained by plotting the calculation results shown in Table 3. The horizontal axis represents the temperature (° C.) detected by the thermistor, and the vertical axis represents the temperature difference (° C.) between the temperature detected by the thermistor 20 and the temperature of the quartz crystal resonator element.

It was found that the temperature difference dT between the temperature detected by the thermistor 20 and the temperature of the quartz crystal resonator element 10 was not lower than −0.07° C. and not higher than 0.00° C. In other words, according to the verification experiment, it was found that if the correspondence of the temperature detected by the thermistor 20 with respect to the temperature of the quartz crystal resonator element 10 fulfills the following formula, a resonator device (the quartz crystal resonator 1) having a good frequency-temperature characteristic can be obtained.

$$|dT| \leq 0.1 (° C.)$$

Further, $|dT| \leq 0.1$(° C.) as the correspondence of the temperature detected by the thermistor 20 is not limited to the schematic configuration of the quartz crystal resonator 1 according to the first embodiment as shown in FIGS. 1A through 1C, but can also be applied to a resonator device provided with a so-called single seal package in which the resonator element and the thermo-sensitive element are housed in a single housing section together with each other.

Further, in the quartz crystal resonator 1, since the distance L2 in the first direction from the mounting surface of the electrode terminals 37a through 37d to the bottom surface 36 of the recessed section 35 is shorter than 0.3 mm, the height reduction can be achieved while decreasing the temperature difference between the temperature of the quartz crystal resonator element 10 and the temperature detected by the thermistor 20.

Thus, it is possible for the quartz crystal resonator 1 to obtain a good frequency-temperature characteristic while achieving the height reduction.

Further, in the quartz crystal resonator 1, since the distance L3 in the first direction between the first imaginary center line O1 of the thermistor 20 and the second imaginary center line O2 of the quartz crystal resonator element 10 is within the range of not smaller than 0.18 mm and not larger than 0.32 mm, the height reduction can further be achieved while decreasing the temperature difference between the temperature of the quartz crystal resonator element 10 and the temperature detected by the thermistor 20.

It should be noted that in the case in which the distance L3 described above is shorter than 0.18 mm, (on the assumption that the further height reduction is difficult for the present) since the thickness of the first layer 31a of the package base 31 becomes smaller than 0.09 mm, the strength of the package base 31 causes a problem.

Further, in the case in which the distance L3 described above exceeds 0.32 mm, the temperature difference between the temperature of the quartz crystal resonator element 10 and the temperature detected by the thermistor 20 increases, and the frequency-temperature characteristic becomes worse, and therefore, there is a possibility that it becomes difficult to cope with an increase in accuracy of the quartz crystal resonator 1.

Further, in the quartz crystal resonator 1, among the four electrode terminals 37a through 37d, the electrode terminal 37c is provided with the projecting section 38 so as to be larger in the area than the other electrode terminals 37a, 37b, and 37d in the planar view, and the tip portion of the projecting section 38 is formed to have a roughly semicircular shape (in other words, the contour of the projecting section 38 includes a curve).

According to the above, in the quartz crystal resonator 1, the projecting section 38 functions as an identification mark of the electrode terminal 37c, and at the same time, the self-alignment effect (an autonomous position restoration phenomenon in reflow mounting when attaching the quartz crystal resonator 1 to the external board via solder) of the quartz crystal resonator 1 can easily be brought out using the electrode terminal 37c large in area as a base point.

Further, in the quartz crystal resonator 1, since the thermo-sensitive element is used as the electronic element, height reduction can be achieved while reducing the temperature difference between the temperature of the quartz crystal resonator element 10 and the temperature detected by the thermo-sensitive element.

Further, in the quartz crystal resonator 1, since the thermistor 20 is used as the thermo-sensitive element, the ambient temperature can correctly be detected due to the characteristic of the thermistor 20. It should be noted that it is also possible to use a temperature measuring semiconductor as the thermo-sensitive element instead of the thermistor 20, and the ambient temperature can accurately be detected due to the characteristic of the temperature measuring semiconductor. As the temperature measuring semiconductor, a diode and a transistor can be cited.

In the detailed description, in the case of the diode, using the forward characteristic of the diode, by measuring the forward voltage, which varies with the temperature, while a constant current is flowing from the anode terminal to the cathode terminal of the diode, the temperature can be detected. Further, in the case of the transistor, by shorting the base and the collector to make the part between the collector and the emitter function as a diode, the temperature can be detected in substantially the same manner as described above.

In the quartz crystal resonator 1, by using the diode or the transistor as the thermo-sensitive element, superimposition of the noise can be reduced.

Modified Example

Then, a modified example of the first embodiment will be explained.

Figure 6A:
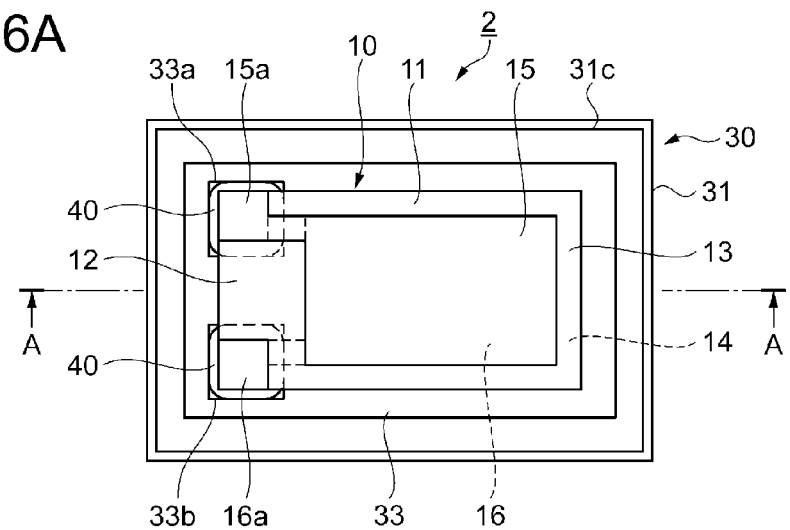
Figure 6B:
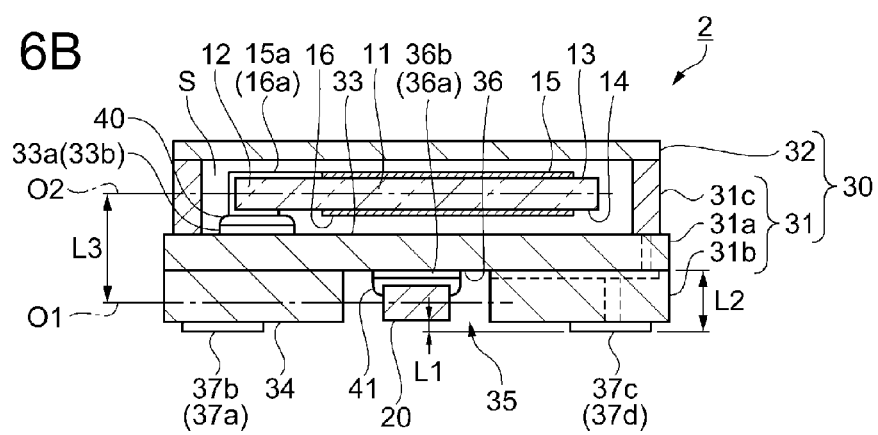
Figure 6C:
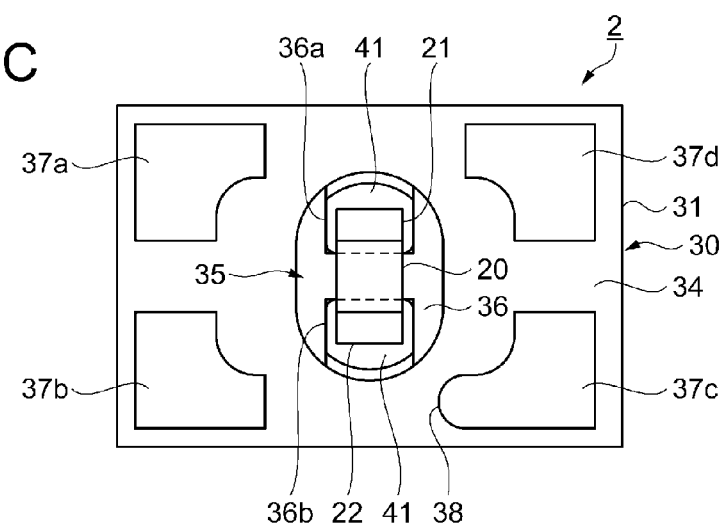

FIGS. 6A through 6C are cross-sectional views showing a general configuration of a quartz crystal resonator according to a modified example of the first embodiment. FIG. 6A is a plan view viewed from the lid side, FIG. 6B is a cross-sectional view along the A-A line shown in FIG. 6A, and FIG. 6C is a plan view viewed from the bottom side.

It should be noted that the parts common to the first embodiment and the modified example are denoted with the same reference numerals, and the detailed explanation thereof will be omitted, while the parts different from those of the first embodiment will mainly be explained.

As shown in FIGS. 6A through 6C, the quartz crystal resonator 2 according to the modified example is different in the arrangement direction of the thermistor 20 compared to the first embodiment.

In the quartz crystal resonator 2, the thermistor is disposed so that the longitudinal direction (the direction of a line connecting the electrodes 21, 22 to each other) of the thermistor 20 intersects (orthogonally, here) with the longitudinal direction (the horizontal direction of the sheet of the drawings) of the package base 31.

Thus, in the quartz crystal resonator 2, it is possible to reduce the degradation of the fixation strength (the bonding strength) of the thermistor 20 due to the warpage of the package base 31 which is thought to have a tendency to have the large warpage in the longitudinal direction in addition to the advantage of the first embodiment.

It should be noted that the configuration of the modified example can also be applied to the following embodiment.

Second Embodiment

Next, another configuration of the quartz crystal resonator as the resonator device will be explained.

Figure 7A:
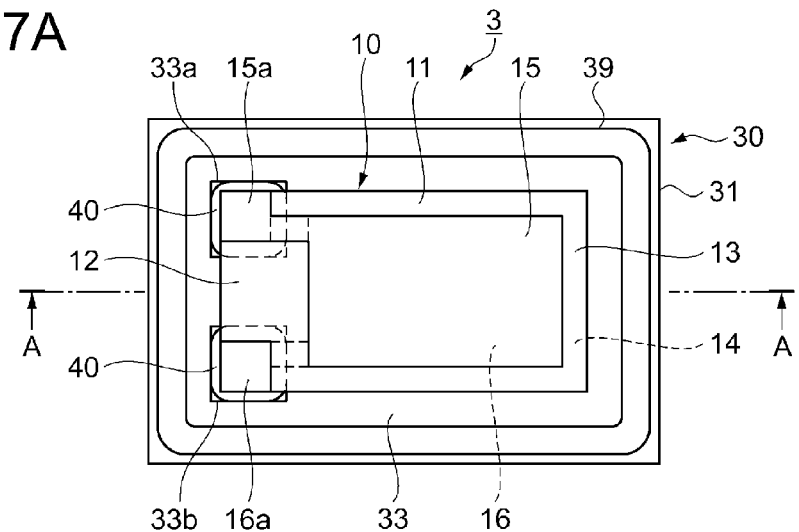
Figure 7B:
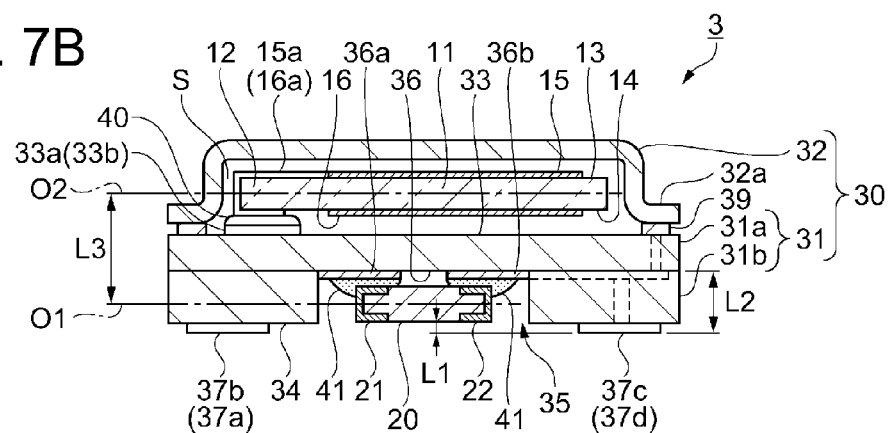
Figure 7C:
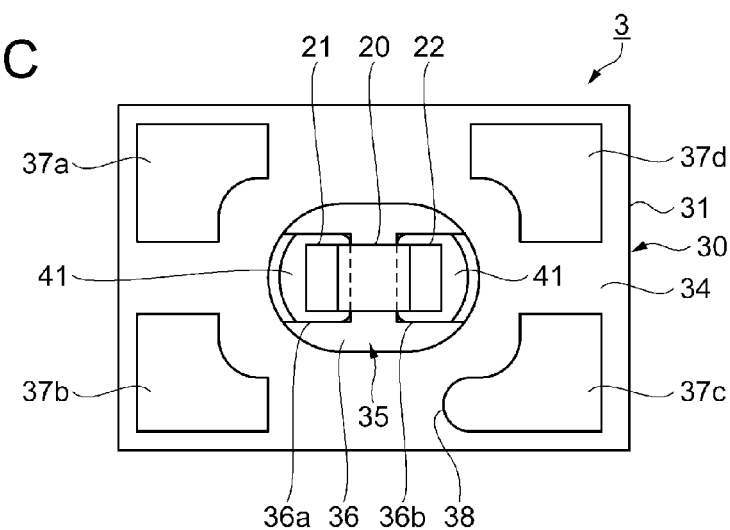

FIGS. 7A through 7C are schematic diagrams showing a general configuration of the quartz crystal resonator according to the second embodiment. FIG. 7A is a plan view viewed from the lid side, FIG. 7B is a cross-sectional view along the A-A line shown in FIG. 7A, and FIG. 7C is a plan view viewed from the bottom side.

It should be noted that the parts common to the first embodiment and the modified example are denoted with the same reference numerals, and the detailed explanation thereof will be omitted, while the parts different from those of the first embodiment will mainly be explained.

As shown in FIGS. 7A through 7C, the quartz crystal resonator 3 according to the second embodiment is different in the configuration of the package base 31 and the lid 32 compared to the first embodiment.

In the quartz crystal resonator 3, the third layer 31c of the package base 31 is removed, and a bonding member 39 with the lid 32 is disposed instead.

The lid 32 is formed to have a cap-like shape with a flange section 32a disposed in the entire circumference using metal such as kovar or 42-alloy.

In the quartz crystal resonator 3, there is assured an internal space S for housing the quartz crystal resonator element 10 using the bulge of the cap portion of the lid 32.

In the lid 32, the flange section 32a is bonded to the first principal surface 33 of the package base 31 via the bonding member 39 having electrical conductivity such as a seam ring, a brazing material, or an electrically-conductive adhesive.

Thus, the lid 32 is electrically connected to the electrode terminal 37c via the conductive via holes and internal wiring in the package base 31 and so on, and thus, the shielding effect is exerted.

It should be noted that the lid 32 can also be electrically connected to the electrode terminal 37c via the electrically-conductive film formed on the castellation not shown disposed on an outer corner of the bonding member 39 and the package base 31.

As described above, in the quartz crystal resonator 3 according to the second embodiment, since the third layer 31c of the package base 31 is removed, the manufacture of the package base 31 becomes easy compared to the first embodiment.

It should be noted that in the quartz crystal resonator 3, it is not required for the lid 32 to electrically be connected to the electrode terminal 37c if no disadvantage for the shield is provided. Thus, the bonding material 39 can be made of an insulating material.

Electronic Apparatus

Next, the electronic apparatus equipped with the resonator device described above will be explained citing a cellular phone as an example.

Figure 8:
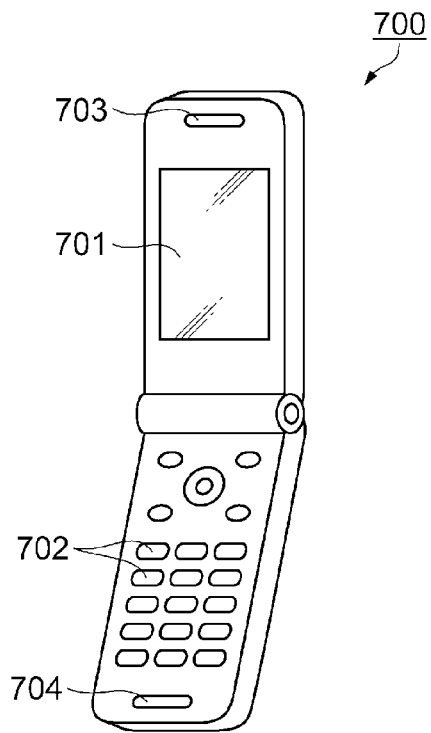
FIG. 8 is a schematic perspective view showing a cellular phone as an electronic apparatus.

FIG. 8 is a schematic perspective view showing a cellular phone as the electronic apparatus.

The cellular phone 700 is equipped with either one of the quartz crystal resonators as the resonator devices described as the embodiments and the modified example.

The cellular phone 700 shown in FIG. 8 uses either one of the quartz crystal resonator elements (1 through 3) described above as, for example, a timing device such as a reference clock oscillation source, and is configured further including a liquid crystal display device 701, a plurality of operation buttons 702, an ear piece 703, and a mouthpiece 704. It should be noted that the configuration of the cellular phone is not limited to the type shown in the drawing, but can also be a so-called smartphone type.

The resonator devices such as the quartz crystal resonators described above can preferably be used as a timing device for an electronic apparatus including an electronic book, a personal computer, a television set, a digital still camera, a video camera, a video cassette recorder, a car navigation system, a pager, a personal digital assistance, an electric calculator, a word processor, a workstation, a video phone, a POS terminal, a gaming apparatus, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges, a flight simulator, and so on besides the cellular phone described above, and in either of the cases, there can be provided the electronic device in which the advantages explained in the embodiments and the modified example described above are obtained, and thus, the excellent performance is exerted.

Mobile Object

Next, the mobile object equipped with any of the resonator devices described above will be explained citing a vehicle as an example.

Figure 9:
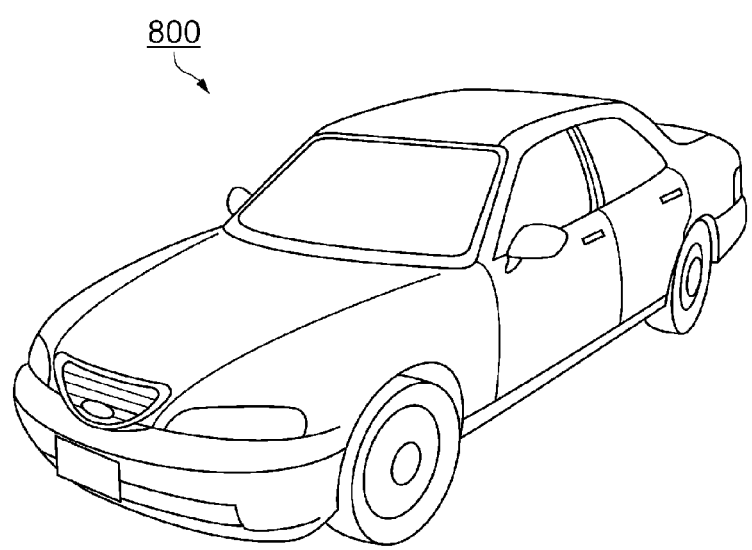
FIG. 9 is a schematic perspective view showing a vehicle as a mobile object.

FIG. 9 is a schematic perspective view showing a vehicle as a mobile object.

The vehicle 800 is equipped with either one of the quartz crystal resonators as the resonator devices described in the embodiments and the modified example.

The vehicle 800 uses either one of the quartz crystal resonators (1 through 3) described above as a timing device such as the reference clock oscillation source of, for example, a variety of electronically-controlled devices (e.g., an electronically-controlled fuel injection device, an electronically-controlled ABS device, and an electronically-controlled constant-speed running device) installed in the vehicle 800.

According to this configuration, the vehicle 800 is equipped with either one of the quartz crystal resonators described above, and is therefore provided with the advantages explained in each of the embodiments and the modified example, and can exert an excellent performance.

The resonator devices such as the quartz crystal resonators described above can preferably be used as the timing device such as a reference clock oscillation source of the mobile objects including a self-propelled robot, a self-propelled carrying apparatus, a train, a boat and ship, an airplane, an artificial satellite, and so on besides the vehicle 800 described above, and in either of the cases, there can be provided the mobile object, which is provided with the advantages explained in the embodiments and the modified example described above, and exerts an excellent performance.

It should be noted that the shape of the resonator element of the quartz crystal resonator is not limited to the plate shape shown in the drawings, but a shape (e.g., a convex type, a bevel type, and a mesa type) that is thick in the center portion and thin in the peripheral portion, or a shape (an inverted mesa type) that is thin in the center portion and thick in the peripheral portion by contraries can also be adopted, or a tuning-fork shape can also be adopted.

It should be noted that the material of the resonator element is not limited to the quartz crystal, but can be a piezoelectric substance such as lithium tantalate ($LiTaO_3$), lithium tetraborate ($Li_2B_4O_7$), lithium niobate ($LiNbO_3$), lead zirconium titanate (PZT), zinc oxide (ZnO), or aluminum nitride (AlN), or a semiconductor such as silicon (Si).

Further, the drive method of the thickness-shear vibration can be the electrostatic drive using the Coulomb force besides those using the piezoelectric effect of the piezoelectric substance.

The entire disclosure of Japanese Patent Application No. 2014-154618 filed Jul. 30, 2014 is expressly incorporated by reference herein.

What is claimed is:

1. A resonator device comprising:
  a substrate having a first principal surface and a second principal surface opposite to the first principal surface, the second principal surface having a recess therein so that the substrate has a ledge on the second principal surface;
  a resonator element mounted on the first principal surface of the substrate;
  a thermo-sensitive element housed in the recess of the second principal surface of the substrate; and
  a plurality of electrode terminals disposed on the ledge of the second principal surface of the substrate, the plurality of electrode terminals being connected to one of the resonator element and the thermo-sensitive element,
  wherein a first distance in a first direction perpendicular to the first principal surface from a mounting surface of the plurality of electrode terminals to an outer surface of the thermo-sensitive element is at least 0.05 mm,
  a second distance in the first direction from the mounting surface of the plurality of electrode terminals to a bottom surface of the recess is less than 0.3 mm, and
  the bottom surface of the recess and an outer surface of the thermo-sensitive element expose to an external environment.

2. The resonator device according to claim 1, wherein another distance in the first direction between a first center line passing through a center of the thermo-sensitive element in the first direction and extending along the first principal surface and a second center line passing through a center of the resonator element in the first direction and extending along the first principal surface is in a range of 0.18 mm and 0.32 mm.

3. The resonator device according to claim 1, wherein one of the plurality of electrode terminals includes a curved projection having a larger area than each of the other of the plurality of electrode terminals in a plan view.

4. The resonator device according to claim 1, wherein the thermo-sensitive element is one of a thermistor and a temperature measuring semiconductor.

5. An electronic apparatus comprising:
  a case; and
  the resonator device according to claim 1 coupled to the case.

6. A mobile object comprising:
  a body; and
  the resonator device according to claim 1 coupled to the body.

7. The resonator device according to claim 1, further comprising:
  a container housing the resonator element and the thermo-sensitive element,
  wherein a temperature difference dT between a temperature of the resonator element and a temperature detected by the thermo-sensitive element is:

$|dT| \leq 0.1 (° C.)$.

8. An electronic apparatus comprising:
  a case; and
  the resonator device according to claim 7 coupled to the case.

9. A mobile object comprising:
  a body; and
  the resonator device according to claim 7 coupled to the body.

* * * * *